United States Patent
Matsui (10) Patent No.: US 7,705,646 B2
(45) Date of Patent: Apr. 27, 2010

(54) THRESHOLD CORRECTION CIRCUIT, INTEGRATED CIRCUIT WITH THRESHOLD CORRECTION FUNCTION, AND CIRCUIT BOARD WITH THRESHOLD CORRECTION FUNCTION

(75) Inventor: Noriyuki Matsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 38 days.

(21) Appl. No.: 12/240,188

(22) Filed: Sep. 29, 2008

(65) Prior Publication Data
US 2009/0027095 A1    Jan. 29, 2009

Related U.S. Application Data

(63) Continuation of application No. PCT/JP2006/306837, filed on Mar. 31, 2006.

(51) Int. Cl.
*H03K 5/01* (2006.01)
(52) U.S. Cl. .......................... 327/165; 327/80; 327/81; 704/246; 381/110; 379/88.01; 379/88.02
(58) Field of Classification Search ............ 327/165
See application file for complete search history.

(56) References Cited

U.S. PATENT DOCUMENTS

2003/0080797 A1    5/2003   Fujikawa

FOREIGN PATENT DOCUMENTS

| JP | 4-152397 A | 5/1992 |
|---|---|---|
| JP | 7-46104 A | 2/1995 |
| JP | 10-336013 A | 12/1998 |
| JP | 2003-133944 A | 5/2003 |

OTHER PUBLICATIONS

International Search Report of PCT/JP2006/306837, date of mailing May 23, 2006.

*Primary Examiner*—Lincoln Donovan
*Assistant Examiner*—John W Poos
(74) *Attorney, Agent, or Firm*—Westerman, Hattori, Daniels & Adrian, LLP (57) ABSTRACT

In order to monitor various types of noises which are to be introduced on signals through signal lines on a circuit board and automatically adjust the thresholds for signal state discriminations to make it possible to surely make a signal state discrimination without being affected by these noises even if the amplitude of a signal is reduced for higher-speed transmission and lowered electric power, there is provided a configuration comprising a signal generation unit generating a noise monitor signal; a noise monitor signal line receiving and propagating the noise monitor signal; a noise detection unit detecting a noise which has been introduced into that noise monitor signal propagated through the noise monitor signal line and which affects a state discrimination using a threshold; and a threshold adjustment unit, if the noise detection unit detects the noise, adjusting the threshold such that the state discrimination is not affected by the noise.

20 Claims, 8 Drawing Sheets

THRESHOLD CORRECTION CIRCUIT, INTEGRATED CIRCUIT WITH THRESHOLD CORRECTION FUNCTION, AND CIRCUIT BOARD WITH THRESHOLD CORRECTION FUNCTION

CROSS REFERENCE TO RELATED APPLICATION(S)

This application is based on and hereby claims priority to PCT International Application No. PCT/JP2006/306837 filed on Mar. 31, 2006, in Japan, the contents of which are hereby incorporated by the reference.

TECHNICAL FIELD

The present invention relates to a technique for, in making a state discrimination with respect to a signal propagated through a signal line on a circuit board such as a PCB (Printed Circuit Board) (a discrimination on whether the level of the signal is in a low potential state or in a high potential state), the correction of a threshold to be used as a reference for this state discrimination.

BACKGROUND ART

In general, on the circuit board such as a PCB, various types of elements such as an integrated circuit are disposed and signal lines are provided between these elements so that a signal is interchanged through the signal lines between the elements. In this case, the level (electric potential) of the signal interchanged through the signal line between the elements takes an electric potential state which is one of a low potential state (Low state) and a high potential state (High state) to achieve the interchange of binary information of "0" and "1" between the aforesaid elements.

On the reception side (for example, an integrated circuit) of such a signal, a state discrimination is made as to whether the level of the signal propagated through the signal line is in a low potential state (Low state, i.e., "0") or in a high potential state (High state, i.e., "1"). This state discrimination is made regarding a threshold (threshold electric potential) as the reference. For example, in a case where a common TTL (Transistor-Transistor Logic) level is employed as a signal level, the amplitude voltage of the signal is 5V, and the signal level (electric potential) of 0.8 V or less is judged to be in a low potential state, the signal level of 2.4 V or more is judged to be in a high potential state, and the signal level between 0.8 V and 2.4 V both inclusive is judged to be in a gray zone, which belongs to neither of these states. That is, the common TTL makes the discrimination on the low potential state and the high potential state, regarding the threshold (0.8V) for the low potential state discrimination and the threshold (2.4V) for the high potential state discrimination as references.

Meanwhile, as a technique for the state judgment using thresholds, for example, there has been proposed the technique disclosed in the following Patent Document 1. According to the disclosure of this Patent Document 1 calculates the similarity between an inputted voice pattern and each of a plurality of standard patterns and compares the calculated similarity with a predetermined threshold to accomplish a voice recognition. In particular, this Patent Document 1 discloses that the aforesaid threshold is strictly set (set to be a small value) in advance in order to avoid the erroneous recognition while the threshold is set to be a large value at the re-input of the inputted speech rejected on the basis of the initial threshold. That is, the threshold is dynamically set in accordance with the result of the voice recognition (reject situation).

Patent Document 1: Japanese Patent Laid-Open (KOKAI) No. HEI 4-152397

DISCLOSURE OF THE INVENTION

Problems to be Solved by the Invention

Meanwhile, in the recent years, the low-level-TTL or the SSTL (Stub Series Terminated Logic)-2 have an attempt to decrease the amplitude (decrease of the amplitude voltage) of a signal with the aim of enhancement of the velocity of the signal transmission on a circuit board, and the signal amplitude voltage has been becoming lower along with the progress of the process and the requirement for the lowering of electric power needed for the signal transmission. Concretely, the low-level-TTL has the signal amplitude voltage of 3.3V, and judges the signal level (electric potential) of 0.8 V or less, the signal level (electric potential) of 2.0 V or more, and the signal level (electric potential) between 0.8 V and 2.0 V both exclusive to be in a low potential state, a high potential state and a gray zone which belongs to neither state, respectively That is, the discrimination between the low potential state and the high potential state is made on the basis of the threshold (0.8V) for the low potential state discrimination and the threshold (2.0V) for the high potential state discrimination serving as the references.

However, the above-mentioned signal amplitude reduction contributes to the high-speed transmission and the lowered electric power, whereas the amplitude reduction causes a signal propagating through a signal line to be susceptible to the influence of noise, which enhances the possibility of an erroneous discrimination at the signal state discrimination. For example, it may be impossible to disregard the crosstalk noise caused by signal lines wired close to each other, simultaneous switching noise, the extraneous noise from the outside of the circuit board, the power supply noise/ground noise caused by the implementation problems on the circuit board, and others. Incidentally, the technique disclosed in the aforesaid Patent Document 1 is related to the threshold for the voice recognition as mentioned above, but it does not relate to a threshold for the state discrimination on a signal propagated through a signal line on a circuit board as related to the present invention.

The present invention has been developed with the above-mentioned problems in view, and the object of the invention is to make is possible to monitor various types of noises affecting a signal in a signal line on a circuit board and automatically adjust a threshold for a signal state discrimination in consideration of the influence of these noises, thereby reliably achieving the signal state discrimination without coming under the influence of the various types of noises even in a case in which the reduction in the amplitude of a signal is made for the purpose of the high-speed transmission and the lowered electric power.

Means for Solving the Problems

For achieving this purpose, in accordance with the present invention, there is provided a threshold correction circuit for correcting a threshold used as a state discrimination reference for a state discrimination on a signal propagated through a signal line wired in a predetermined area, comprising: a signal generation unit generating a noise monitor signal; a noise monitor signal line wired in the predetermined area, and receiving and propagating the noise monitor signal generated by the signal generation unit; a noise detection unit detecting a noise which has been introduced into the noise monitor signal propagated through the noise monitor signal line and which affects the state discrimination using the threshold; and a threshold adjustment unit, if the noise detection unit detects the noise, adjusting the threshold such that the state discrimination is not affected by the noise.

Further, there is provided an integrated circuit with a threshold correction function which is mounted on a circuit board, which communicates with another integrated circuit on the circuit board by a signal through a signal line and which makes a state discrimination on the signal propagated through the signal line, regarding a threshold as a reference, comprising: a signal generation unit generating a noise monitor signal; a noise monitor signal outputting terminal outputting the noise monitor signal generated by the signal generation unit to a noise monitor signal line wired so as to start from the integrated circuit and turn back to the integrated circuit; a noise monitor signal inputting terminal inputting the noise monitor signal, propagated through the noise monitor signal line, from the noise monitor signal line to the integrated circuit; a noise detection unit detecting a noise which has been introduced into the noise monitor signal input via the noise monitor inputting terminal and which affects the state discrimination using the threshold; and a threshold adjustment unit, if the noise detection unit detects the noise, adjusting the threshold such that the state discrimination is not affected by the noise.

Still further, in accordance with the present invention, there is provided a circuit board with a threshold correction function on which two or more integrated circuits that communicate with each other by a signal through a signal line and that make a state discrimination on the signal propagated through the signal line, regarding a threshold as a reference, are mounted, comprising: a signal generation unit generating a noise monitor signal; a noise monitor signal line wired among the two or more integrated circuits, and receiving and propagating the noise monitor signal generated by the signal generation unit; a noise detection unit detecting a noise which has been introduced into the noise monitor signal propagated through the noise monitor signal line and which affects the state discrimination using the threshold; and a threshold adjustment unit, if the noise detection unit detects the noise, adjusting the threshold such that the state discrimination is not affected by the noise. In this case, the signal generation unit, the noise detection unit and the threshold adjustment unit may be included in a first integrated circuit among the two or more integrated circuit; and the noise monitor signal line may be wired so as to extend in the vicinity of a second integrated circuit among the two or more integrated circuits from the first integrated circuit and turn back from the vicinity to the first integrated circuit.

In the above-mentioned threshold correction circuit, integrated circuit with a threshold correction function and circuit board with a threshold correction function, in the state discrimination which determines the signal to be in a low potential state when a level of the signal is the threshold or less while determines the signal not to be in the low potential state when the level of the signal exceeds the threshold, the signal generation unit may generate, as the noise monitor signal, a noise monitor signal in the low potential state, and inputs the noise monitor signal into the noise monitor signal line, and the noise detection unit may detect, as the noise, a state in which the level of the noise monitor signal to be in the low potential state propagated through the noise monitor signal line exceeds the threshold. In addition, the noise detection unit may count at least one of the number of times of signal rise, at which the level of the noise monitor signal is shifted from a state of being the threshold or less to a state in excess of the threshold, and the number of times of signal fall, at which the level of the noise monitor signal shifts from a state in excess of the threshold to a state of being the threshold or less; and the threshold adjustment unit may adjust the threshold in accordance with one or more counts made by the noise detection unit. In this case, the threshold adjustment unit may adjust the threshold to be higher if the counts are larger.

Moreover, in the above-mentioned threshold correction circuit, integrated circuit with a threshold correction function and circuit board with a threshold correction function, in the state discrimination which determines the signal to be in a high potential state when a level of the signal is the threshold or more while determines the signal not to be in the high potential state when the level of the signal is less than the threshold, the signal generation unit may generate, as the noise monitor signal, a noise monitor signal in the high potential state, and inputs the noise monitor signal into the noise monitor signal line, and the noise detection unit may detect, as the noise, a state in which the level of the noise monitor signal to be in the high potential state propagated through the noise monitor signal line is lower than the threshold. Still moreover, the noise detection unit may count at least one of the number of times of signal fall, at which the level of the noise monitor signal shifts from a state of being the threshold or more to a state of being less than the threshold, and the number of times of signal rise, at which the level of the noise monitor signal is shifted from a state of being less than the threshold to a state of being the threshold or more; and the threshold adjustment unit may adjust the threshold in accordance with the result of the counting made by the noise detection unit. In this case, the threshold adjustment unit may adjust the threshold to be lower if the counts are larger.

Effects of the Invention

Thus, according to the threshold correction circuit, integrated circuit with a threshold correction function and circuit board with a threshold correction function of the present invention, a noise monitor signal generated by the signal generation unit propagates through a noise monitor signal line wired in a predetermined area (region between integrated circuits which interchange a signal through a signal line on a circuit board), and the noise detection unit detects a noises which has been introduced into a noise monitor signal in the noise monitor signal line and which affects the state discrimination using a threshold and, if the noise detection unit has detected the noise, the threshold adjustment unit adjusts the threshold so that the state discrimination is immune to the noise. That is, various types of noises affecting a signal in a signal line on a circuit board are monitored and the threshold for the signal state discrimination is automatically adjusted in consideration of the influence of the noises, which enables the signal state discrimination to be reliably accomplished without suffering from the influence of the various types of noises even in a case in which the reduction in the amplitude of the signal is made for the purpose of the implementation of the high-speed transmission and the lowered electric power.

DESCRIPTION OF THE REFERENCE NUMERALS 1 circuit board (PCB) with threshold correction function
2 integrated circuit with threshold correction function
2a signal inputting terminal
2b noise monitor signal outputting terminal
2c noise monitor signal inputting terminal
3 integrated circuit (another integrated circuit)
3a signal outputting terminal
4 signal line
5 noise monitor signal line
6 state discrimination unit
61 input circuit (inverter)
62, 63 variable resistor units (R1 and R2)
63a, 63b, 63c resistors (r1, r2, and r3)
63d, 63e, 63f switching transistors
63g transistor for variable register
10 threshold correction circuit
11 switching unit (switch)
12 signal generation unit
13 noise detection unit (counter)
14 threshold adjustment unit (demultiplexer, D/A converter)
15 control unit

BEST MODE FOR CARRYING OUT THE INVENTION

With the reference to the drawings, a description of an embodiment of the present invention will be given hereinbelow.

First of all, referring to FIG. 1, a description will be given in relation to a configuration of a circuit board 1 with a threshold correction function which is equipped with an integrated circuit 2 (threshold correction circuit 10) with a threshold correction function according to an embodiment of the present invention.

Figure 1:
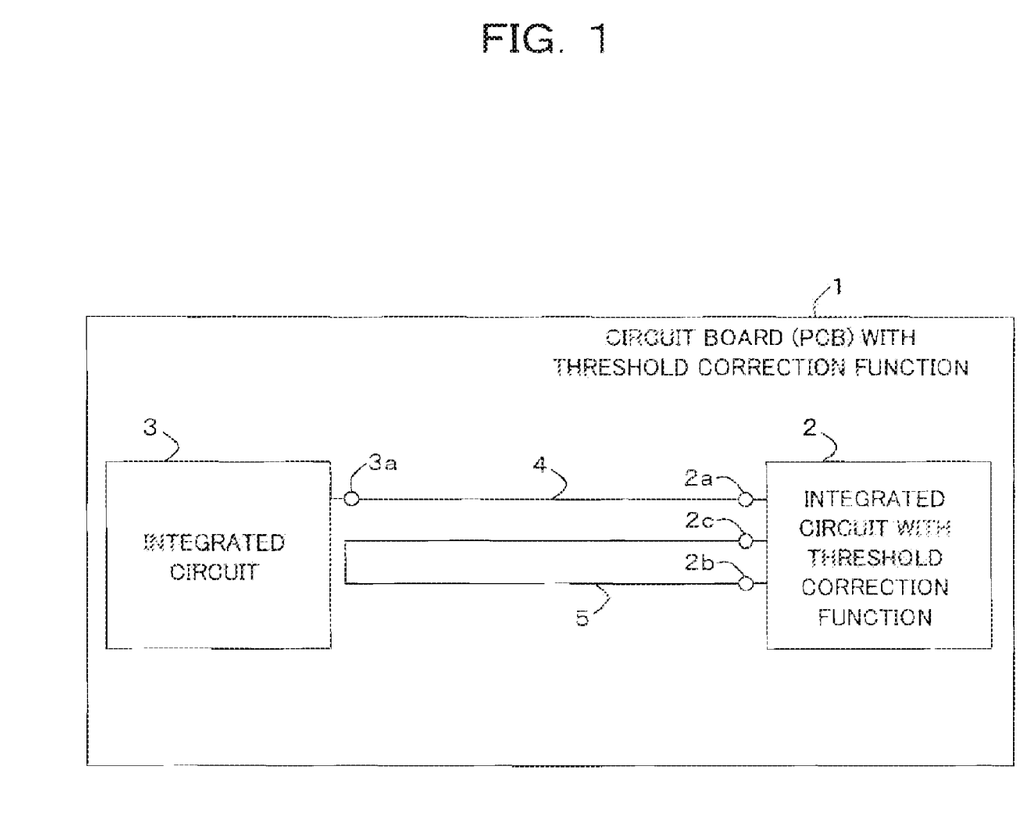
FIG. 1 A block diagram showing a configuration of a circuit board with a threshold correction function equipped with an integrated circuit (threshold correction circuit) with a threshold correction function according to an embodiment of the present invention.

FIG. 1 is a block diagram showing the configuration of the circuit board 1. As shown in FIG. 1, the circuit board (PCB) 1 according to this embodiment has at least two integrated circuits 2 and 3, between which a signal line 4 is wired. The signal line 4 may take the form of a bus arrangement or a one-way communication path. The present invention assumes a one-way communication path to transmit a signal from the integrated circuit 3 to the integrated circuit 2. That is, one end of the signal line 4 is connected to a signal outputting terminal 3a of the integrated circuit 3 while the other end of the signal line 4 is connected to a signal inputting terminal 2a of the integrated circuit 2. Thus, the signal transmission between the integrated circuits 2 and 3 is made through the signal line 4.

This case premises that the signal levels of both the integrated circuits 2 and 3 correspond to each other. The signal level is exemplified by the TTL level, the CMOS (Complementary Metal Oxided Semiconductor) level and the ECL (Emitter Coupled Logic) level in addition to the above-mentioned low-level TTL, SSTL-2, and others. Moreover, in at least the integrated circuit 2, the state discrimination on the signal propagated from the integrated circuit 3 through the signal line 4 is made by a state discrimination unit 6 (see FIG. 2) which will be mentioned below, using a predetermined threshold as a reference.

Furthermore, in the circuit board 1 according to this embodiment, a noise monitor signal line 5 is wired in an area (predetermined area) along the signal line 4 in the area between the two integrated circuits 2 and 3. One end of this noise monitor signal line 5 is connected to a noise monitor signal outputting terminal 2b of the integrated circuit 2 while the other end thereof is connected to the noise monitor signal inputting terminal 2c of the integrated circuit 2. This noise monitor signal line is wired so as to extend from the integrated circuit 2 to the vicinity of the integrated circuit 3 which is the communication partner (the signal-transmitting source) and turn back from this vicinity up to the integrated circuit 2. A noise monitor signal generated by a signal generation unit 12 (see FIG. 2), which will be mentioned below, in this integrated circuit 2 is inputted through the noise monitor signal outputting terminal 2b to the noise monitor signal line 5, and the noise monitor signal propagating through the noise monitor signal line 5 is inputted from the noise monitor signal line 5 through the noise monitor signal inputting terminal 2c to the integrated circuit 2.

Subsequently, referring to FIG. 2, a description will be given in relation to a functional configuration of an integrated circuit 2 (threshold correction circuit 10) with a threshold correction function according to the embodiment of the present invention.

Figure 2:
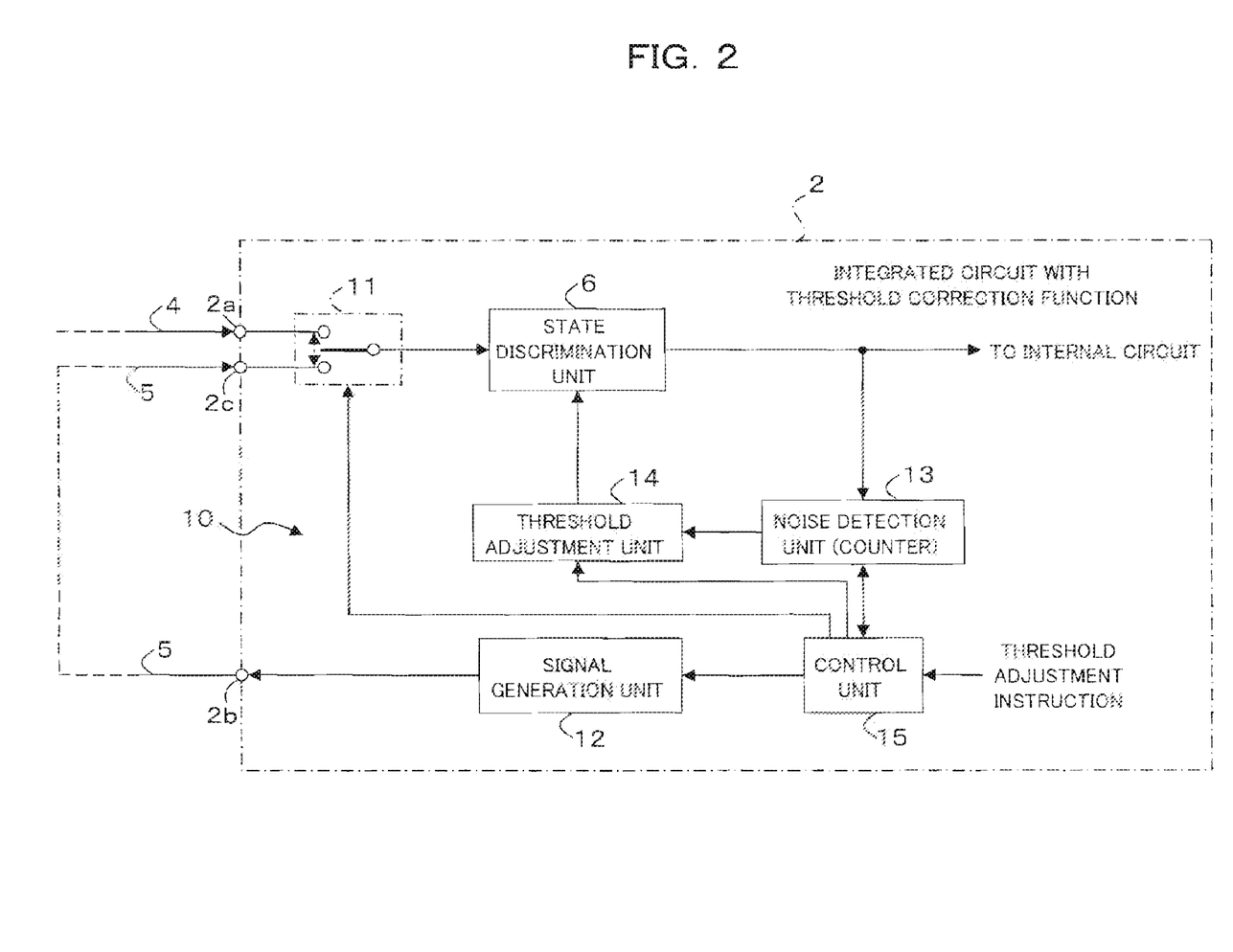
FIG. 2 A block diagram showing a functional configuration of an integrated circuit (threshold correction circuit) with a threshold correction function according to an embodiment of the present invention.

FIG. 2 is a block diagram showing this functional configuration. As shown in FIG. 2, the integrated circuit 2 having a threshold correction function according to this embodiment has an internal circuit (a circuit section which fulfills the intended function of the integrated circuit 2), not shown, and further includes a state discrimination unit 6, a switching unit 11, a signal generation unit 12, a noise detection unit 13, a threshold adjustment unit 14 and a control unit 15.

In this configuration, the state discrimination unit 6 fulfills a function as an input unit to receive a signal propagated from the other integrated circuit 3 through the signal line 4 and input the input signal into the aforesaid internal circuit, and makes a state discrimination on the signal propagated through the signal line 4 using a predetermined threshold as a reference. Although the function as this state discrimination unit 6 is provided in an input unit of a common integrated circuit, the predetermined threshold is fixedly set in the common integrated circuit, while in the state discrimination 6 according to this embodiment, the predetermined threshold is designed to be changeable (variable) by the configuration which will be described below with reference to FIGS. 3 to 5. In addition, to the state discrimination unit 6 according to this embodiment, through the switching unit which will be mentioned below, one of a signal propagated from the other integrated circuit 3 through the signal line 4 and a noise monitor signal propagated through the noise monitor signal line 5 is inputted via the switching unit 11 that is to be described below, and while the integrated circuit 2 is in a normal operation, there is inputted a signal propagated through the signal line 4 is input into the state discrimination unit 6 and, during a noise monitor term which will be mentioned later, a noise monitor signal propagated through the noise monitor signal line 5 is input.

In this state discrimination unit 6, let it be assumed that a state discrimination is made on the basis of, as a predetermined threshold, a threshold for a low potential state discrimination or a threshold for a high potential state discrimination. That is, the state discrimination unit 6 according to this embodiment is designed so as to make a low potential state discrimination that determines a signal of the discrimination object to be in a low potential state when the level of the signal is a threshold for a low potential state discrimination or less while determines the signal not to be in a low potential state when the level of the signal exceeds the threshold for a low potential state discrimination or makes a high potential state discrimination that determines a signal of the discrimination object to be in a high potential state when the level of the signal is a threshold for a high potential discrimination while determines the signal not to be in a high potential state when the level of the signal is more than the threshold for a high potential state discrimination.

More specifically, in execution of the above low potential state discrimination, the state discrimination unit 6 of this embodiment is designed to output a signal in a low potential state (Low state/"0") when the level of the signal that is to be discriminated stands at the low potential state discrimination threshold or less while output a signal in a high potential state (High state/"1") signal when the level of the signal that is to be discriminated exceeds the low potential state discrimination threshold. On the other hand, in the high potential state discrimination, the state discrimination unit 6 of this embodiment is designed to output a signal in the high potential state (High state/"1") when the level of the signal that is to be discriminated stands at the high potential state discrimination threshold or more while outputs a signal in the low potential state (Low state/"0") signal when the level of the signal that is to be discriminated is less than falls below the high potential state discrimination threshold. Incidentally, the state discrimination unit 6 may executed either one of the low potential state discrimination and the high potential state discrimination or both the low potential state discrimination and the high potential state discrimination.

Furthermore, as described above with reference to FIG. 1, the integrated circuit 2 of this embodiment comprises a signal inputting terminal 2a for inputting a signal, propagated from the integrated circuit 3 through the signal line 4, from the signal line 4 to this integrated circuit 2, a noise monitor signal outputting terminal 2b for outputting a noise monitor signal, generated by the signal generation unit 12 which will be mentioned below, to the noise monitor signal line 5, and a noise monitor signal inputting terminal 2c for inputting the noise monitor signal, propagated through the noise monitor signal line 5, from the noise monitor signal line 5 to this integrated circuit 2. Incidentally, the signal inputting terminal 2a is usually provided in a common integrated circuit, whereas the noise monitor signal outputting terminal 2b and the noise monitor signal inputting terminal 2c are newly provided in order to realize the present invention.

The switching unit 11 is controlled by the control unit 15 which will be mentioned below. As mentioned above, the switching unit 11 functions as a switch to, when the integrated circuit 2 conducts the normal operation, make a connection between the signal inputting terminal 2a (signal line 4) and the state discrimination unit 6 to input a signal, propagated through the signal line 4, to the state discrimination unit 6 while, at the implementation of the noise monitor (during the noise monitor term), make a connection between the noise monitor signal inputting terminal 2c (noise monitor signal line 5) and the state discrimination unit 6 to input a noise monitor signal, propagated through the noise monitor signal line 5, to the state discrimination unit 6.

The signal generation unit 12 is controlled by the control unit 15, which will be mentioned below, and generates a noise monitor signal during a noise monitor term. If the state discrimination unit 6 carries out the low potential state discrimination, this signal generation unit 12 generates a noise monitor signal in a low potential state (Low state/"0") and inputs the generated signal via the noise monitor signal outputting terminal 2b to the noise monitor signal line 5. On the other hand, when the state discrimination unit 6 conducts the high potential state discrimination, the signal generation unit 12 generates a noise monitor signal in a high potential state (High state/"1") and inputs the generated signal via the noise monitor signal outputting terminal 2b to the noise monitor signal line 5. If the state discrimination unit 6 carries out both the low potential state discrimination and the high potential state discrimination, for example, the signal generation unit 12 generates, during the noise monitor period, a noise monitor signal like a clock signal which alternately takes the low potential state (Low state/"0") and the high potential state (High state/"1") in a given cycle, as mentioned below with reference to FIGS. 6 and 7. Also when the state discrimination unit 6 conducts one or the other of the low potential state discrimination and the high potential state discrimination, the above-mentioned clock signal can be generated and used as a noise monitor signal and, in this embodiment, a description will be given in relation to an example employing a configuration manageable this case.

The noise detection unit 13 is controlled by the control unit 15 to be mentioned below and detects the noises introduced into a noise monitor signal which has been propagated through the noise monitor signal line 5 and has turned back to the integrated circuit 2 (a noise monitor signal inputted from the noise monitor signal inputting terminal 2c) during the noise monitor term, a noise affecting the low potential state discrimination or the high potential state discrimination using a low potential state discrimination threshold or high potential state discrimination threshold performed in the state discrimination unit 6.

In particular, the noise detection unit 13 according to this embodiment monitors an output (the result of the state discrimination based on the threshold) from the state discrimination unit 6 during the noise monitor term and, in the low potential state discrimination made by the noise detection unit 13, the state discrimination unit 6 detects the state discrimination unit 6 carries out the low potential state discrimination, detects, as a noise, a state in which the level of a noise monitor signal propagated through the noise monitor signal line 5, which is to be in the low potential state, exceeds the threshold for the low potential state discrimination. More specifically, in this embodiment, the noise detection unit 13 counts at least one or the other of the number of times of signal rise and the number of times of signal fall with respect to an output (the result of the state discrimination based on the threshold) from the state discrimination unit 6 and thereby functions as a counter to count at least one of the number of times of signal rise at which the level of this noise monitor signal is shifted from a state of the low potential state discrimination threshold or less to a state of being more than the low potential state discrimination threshold and the number of times of signal fall at which the level of this noise monitor signal is shifted from a state of being more than the low potential state discrimination threshold to a state of being the low potential state discrimination threshold or less.

In addition, according to this embodiment, in the high potential state discrimination made by the state discrimination unit 6, the noise detection unit 13 detects, as a noise, a state in which the level of a noise monitor signal propagated through the noise monitor signal line 5, which is to be in the high potential state, falls below the threshold for the high potential state discrimination. Also in this case, the noise detection unit 13 counts at least one of the number of times of signal rise of an output (the result of the state discrimination based on the threshold) from the state discrimination unit 6 and the number of times of signal fall thereof, so it functions as a counter to count at least one or the other of the number of times of signal fall at which the level of the noise monitor signal is shifted from a state of being the high potential state discrimination threshold to a state of being less than the high potential state discrimination threshold and the number of times of signal rise at which the level of the noise monitor signal is shifted from a state of being less than the high potential state discrimination threshold to a state in excess of the high potential state discrimination threshold.

The presence or absence of a noise (whether or not a noise is introduced into the noise monitor signal) is judged on the basis of the count value obtained by the counter function of this noise detection unit 13. That is, an ideal count value (the number of times thereof) to be measured by the noise detection unit 13 when no introduced noise exists can be obtained in advance on the basis of the length of the noise monitor term and the cycle of the signal generation unit 12 and, if the actually measured count value obtained by the noise detection unit 13 exceeds the ideal count value, a judgment can be made that a noise has been introduced into the noise monitor signal. Moreover, by checking the excess degree of the actually measured count value obtained by the noise detection unit 13 over the ideal count value (the difference between the actually measured count value and the ideal count value), it is also possible to make a judgment on the degree of the influence of the noise on the signal at the setting of the current threshold for the noise monitor signal. For example, if the actually measured count value greatly exceeds the ideal count value, it is possible to make a judgment that the current threshold setting is strict and, hence, the signal propagating through the noise monitor signal line 5 (i.e., the signal line 4) easily picks up noises.

The threshold adjustment unit 14 is controlled by the control unit 15, which will be mentioned below, and adjusts, when a noise has been detected by the noise detection unit 13, the threshold for the low potential state discrimination or the threshold for the high potential state discrimination such that the state discrimination by the state discrimination unit 6 is immune to the noise. Concretely, it is configured as one of a demultiplexer and a D/A converter each of which will be mentioned below with reference to FIGS. 4 and 5, respectively.

In particular, when the state discrimination unit 6 conducts the low potential state discrimination, the threshold adjustment unit 14 according to this embodiment is designed to adjust the threshold for the low potential state discrimination on the basis of a count value obtained by the noise detection unit 13 and, at this time, it adjusts the threshold for the low potential state discrimination in the state discrimination unit 6 to be higher as the count value increases (that is, as the difference between the actually measured count value and the ideal count value becomes larger). In addition, when the state discrimination unit 6 conducts the high potential state discrimination, the threshold adjustment unit 14 of this embodiment is designed to adjust the threshold on the basis of a count value obtained by the noise detection unit 13 and, at this time, it adjusts the threshold for the high potential state discrimination in the state discrimination unit 6 to be lower as the count value increases (that is, as the difference between the actually measured count value and the ideal count value becomes larger).

In this case, it is also acceptable that the adjustment quantity of the threshold (each threshold changing quantity) is changed according to the actually measured count value (or the difference between the actually measured count value and the ideal count value), or that the threshold adjustment quantity is always set at a constant value and the aforesaid noise monitor and threshold adjustment are repeatedly made until the noise detection unit 13 detects no noise (that is, until the actually measured count value and the ideal count value agree with each other).

At the start-up (turning-on of the power source) of the circuit board 1 (integrated circuit 2) or upon receipt of a periodic threshold adjustment instruction or an unscheduled threshold adjustment instruction from an external entity, the control unit 15 sets a noise monitor term of a specific time period and controls the operations of the switching unit 11, the signal generation unit 12, the noise detection unit 13 and the threshold adjustment unit 14 so that no noise is detected by the noise detection unit 13 (that is, so that the actually measured count value agrees with the ideal count value).

In the circuit board 1 and integrated circuit 2 configured as described above, as shown in FIG. 2, the threshold correction circuit 10 according to this embodiment comprises the noise monitor signal line 5 which is wired on the circuit board 1, and the switching unit 11, the signal generation unit 12, the noise detection unit 13, the threshold adjustment unit 14 and the control unit 15 which are placed within the integrated circuit 2.

Figure 3:
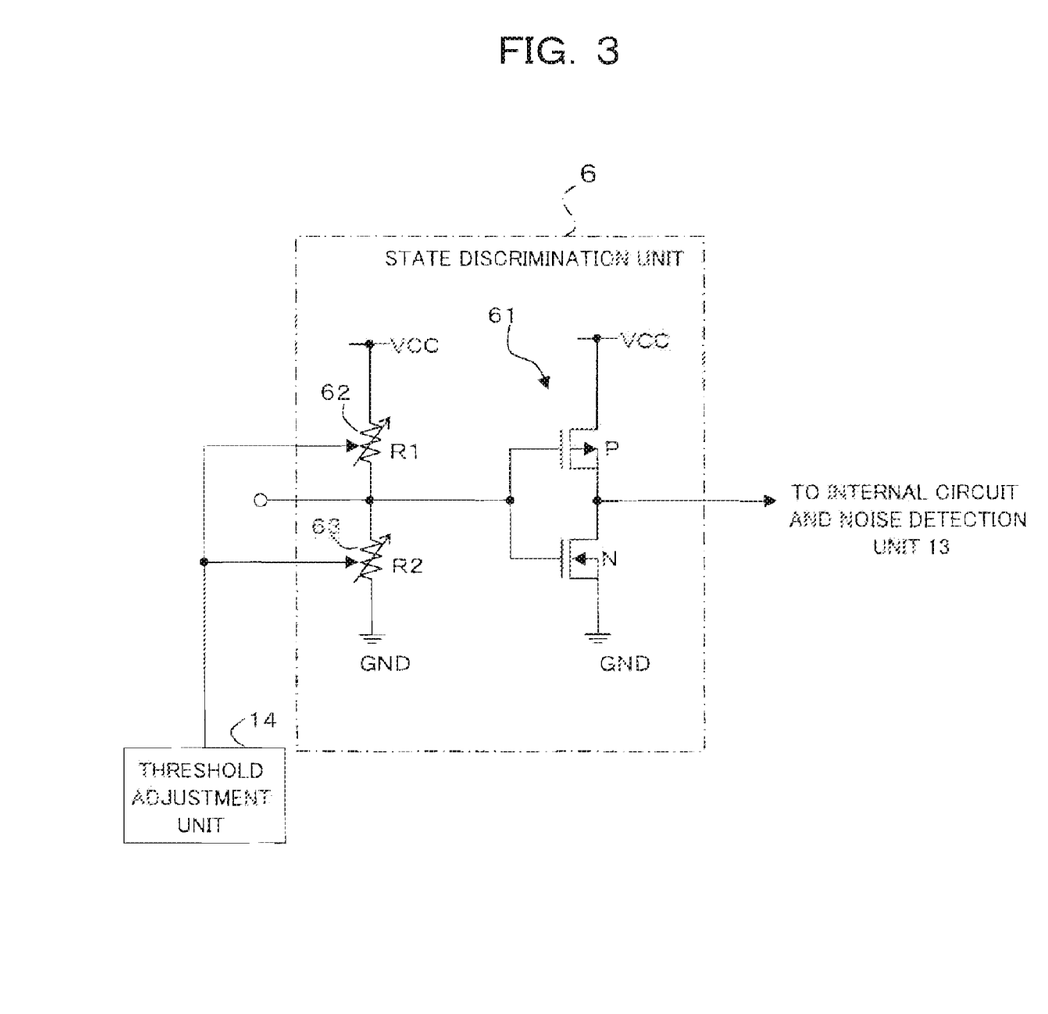
FIG. 3 An illustration of an example of a concrete configuration of a state discrimination unit in an integrated circuit (threshold correction circuit) with a threshold correction function according to this embodiment.

Referring to FIG. 3, a description will be given hereinbelow of an example of a concrete arrangement of the state discrimination unit 6 in the integrated circuit 2 (threshold correction circuit 10) with the threshold correction function according to this embodiment.

FIG. 3 is an illustration of the example of the concrete arrangement thereof. As shown in FIG. 3, the state discrimination unit 6 according to this embodiment is composed of an input circuit 61 and variable resistor units 62, 63.

The input circuit 61 receives, through the switching unit 11, the input of a signal from the signal line 4 or a noise monitor signal from the noise monitor signal line 5, and outputs a result of the state discrimination on this signal to an internal circuit (not shown) and the noise detection unit 13. This input circuit 61 takes the form of an inverter comprising a pair of P-channel transistor and N-channel transistor.

The variable resistor units 62 and 63 are located on the input side of the input circuit 61 having, for example, an arrangement mentioned below with reference to FIGS. 4 and 5. The variable resistor unit 62 is put between the power supply VCC and an input line of the input circuit (inverter) 61 while the variable resistor unit 63 is interposed between the input line of the input circuit (inverter) 61 and the ground (GND).

These variable resistor units 62 and 63 are capable of changing the setting of the low potential state discrimination threshold or the high potential state discrimination threshold serving as a reference for the state discrimination to be made by the state discrimination unit 6 (input circuit 61). By changing the setting of the resistance values R1 and R2 in accordance with an instruction from the threshold adjustment unit 14, it is possible to adjust the low potential state discrimination threshold or the high potential state discrimination threshold. Incidentally, both the variable resistor units 62 and 63 may be placed into a resistance value variable state, or one of the variable resistor units 62 and 63 may also be placed into a resistance value variable state.

In this state discrimination unit 6, when the resistance value R1 is set at a smaller value or the resistance value R2 is set at a larger value (alternatively, when the resistance value R1 is set at a smaller value and, at the same time, the resistance value R2 is set at a larger value), the low potential state discrimination threshold or the high potential state discrimination threshold is varied to be higher. Conversely, when the resistance value R1 is set at a larger value or the resistance value R2 is set at a smaller value (alternatively, when the resistance value R1 is set at a larger value and, at the same time, the resistance value R2 is set at a smaller value), the low potential state discrimination threshold or the high potential state discrimination threshold is varied to be lower.

As mentioned above, modification of the setting for the resistance values R1 and R2 of the variable resistor units 62 and 63 t by the threshold adjustment unit 14 varies the low potential state discrimination threshold or the high potential state discrimination threshold, so that the input circuit (inverter) 61 makes the state discrimination according to the threshold obtained by the modification. That is, the input circuit 61 is designed to perform: the low potential state discrimination in which a signal of a low potential state (Low state/"0") is output when the level of an input signal is the threshold for the low potential state discrimination or less while a signal of a high potential state (High state/"1") when the level of the input signal is in excess of the threshold for the low potential state discrimination; or the high potential state discrimination in which a signal of a high potential state (High state/"1") is output when the level of an input signal is the threshold for the high potential state discrimination or more while outputs a signal of a low potential state (Low state/"0") when the level of the input signal is less than the threshold for the high potential state discrimination.

Figure 4:
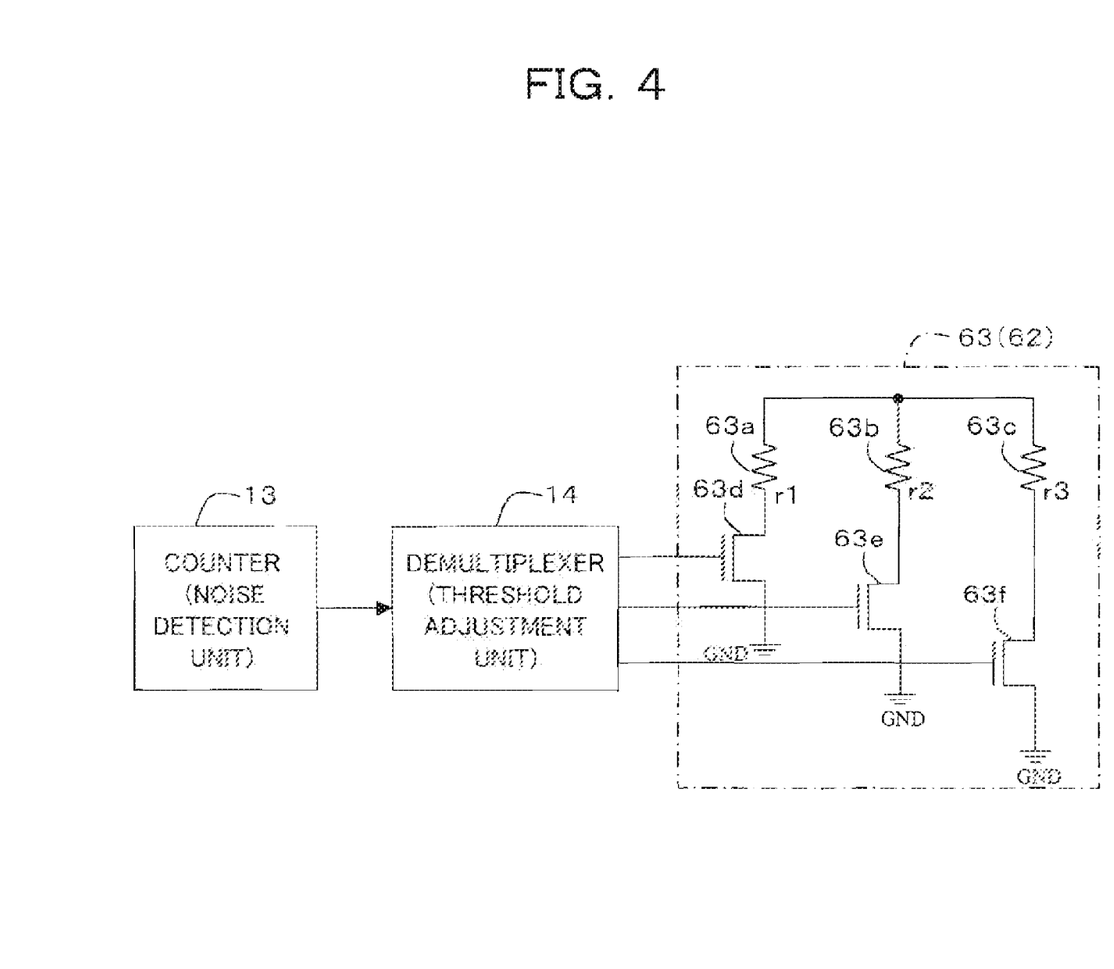
FIG. 4 An illustration of a configuration of an essential part of an integrated circuit (threshold correction circuit) with a threshold correction function according to this embodiment, which employs a first threshold adjusting manner.
Figure 5:
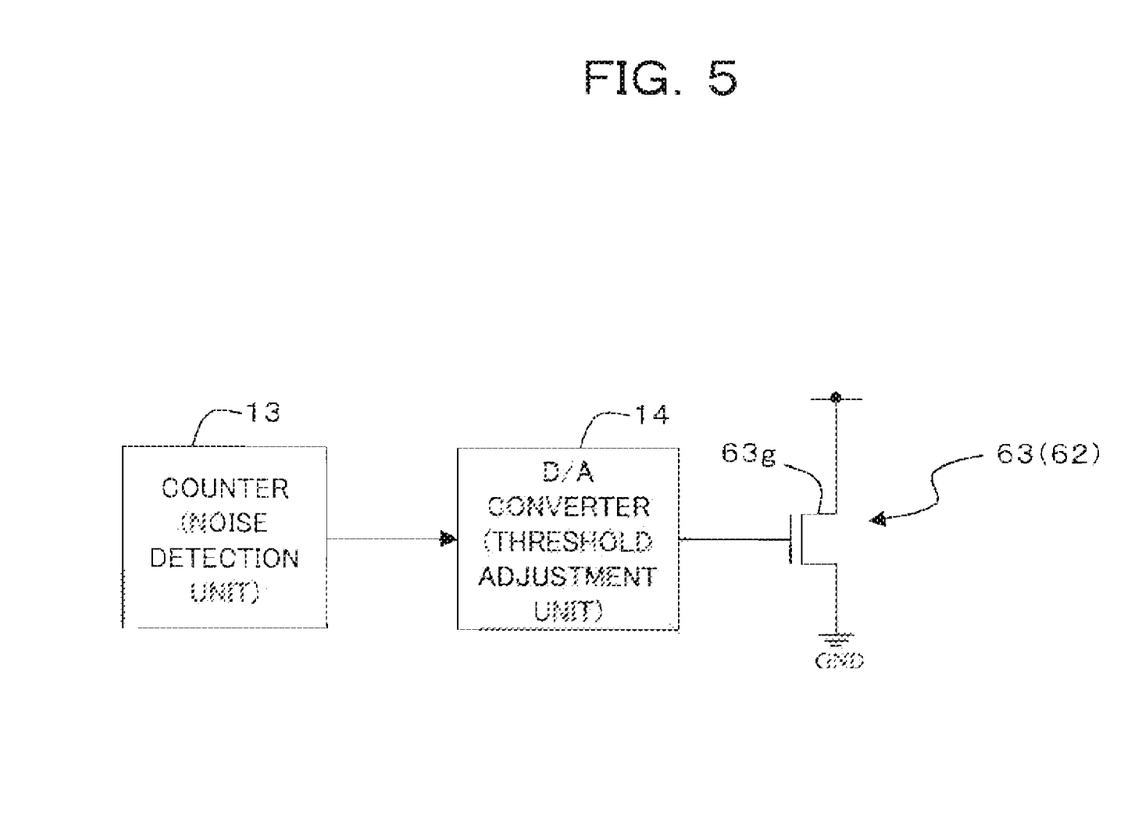
FIG. 5 An illustration of a configuration of an essential part of an integrated circuit (threshold correction circuit) with a threshold correction function according to this embodiment, which employs a second threshold adjusting manner.

Referring to FIGS. 4 and 5, a description will be given hereinbelow in relation to the configuration of the variable resistor unit 63.

FIG. 4 is an illustration of an essential part of the integrated circuit 2 (threshold correction circuit 10) with the threshold correction function according to this embodiment which employs a first threshold adjustment method. The variable resistor unit 63 shown in FIG. 4 includes three resistors 63a, 63b and 63c respectively having different resistance values r1, r2 and r3 and switching transistors 63d, 63e and 63f respectively connected in series to the resistors 63a, 63b and 63c. The resistors 63a, 63b and 63c are placed in parallel with one another between the input line of the input circuit (inverter) 61 and the ground (GND).

In addition, in the example shown in FIG. 4, the threshold adjustment unit 14 is configured to be a demultiplexer (selector) designed to on-drive (apply a gate voltage to) at least one of the switching transistors 63d, 63e and 63f for using at least one of the three resistors 63a, 63b and 63c according to a count value (or a difference between an actually measured count value and an ideal count value) attained as the result of counting by the noise detection unit (counter) 13. At this time, in a low potential state discrimination made by the state discrimination unit 6, a selection is made among the resistors 63a, 63b and 63c so that a larger measured count makes the resistance value R2 larger and the threshold for the low potential state discrimination becomes higher. On the other hand, in a high potential state discrimination made by the state discrimination unit 6, a selection is made among the resistors 63a, 63b and 63c so that a larger measured count makes the resistance value R2 smaller and the threshold for the high potential state discrimination becomes lower.

Although only the arrangement of the variable resistor unit 63 is shown in FIG. 4, the variable resistor unit 62 can also be arranged like the variable resistor unit 63 shown in FIG. 4. When the state discrimination unit 6 performs the low potential state discrimination, the variable resistor unit 62 makes a selection for one or more resistors so that a larger measured count makes the resistance value R1 smaller to make the low potential state discrimination threshold higher. On the other hand, in the high potential state discrimination made by the state discrimination unit 6, the resistor selection is made so that the resistance value R1 is set at a larger value as the count value increases to make the high potential state discrimination threshold lower.

FIG. 5 is an illustration of an essential part of an integrated circuit 2 (threshold correction circuit 10) with a threshold correction function according to this embodiment which employs a second threshold adjustment method. In the example shown in FIG. 5, the variable resistor unit 63 takes the form of a transistor 63g for a variable register, which transistor 63g is interposed between the input line of the input circuit (inverter) 61 and the ground (GND).

In the example shown in FIG. 5, the threshold adjustment unit 14 takes the form of a D/A (Digital/Analog) converter that converts a digital signal (a binary signal) to an analog signal (a voltage), and converts a measured count (or a difference between an actual measured count and an ideal measured count) given in the form of a digital signal by the noise detection unit (counter) 13 to a voltage in accordance with the measured count. Then the obtained voltage is applied to the gate of the transistor 63g for a variable resistor to modify the on-resistance value (R2) of the transistor 63g for a variable resistor. At this time, if the state discrimination unit 6 makes a low potential state discrimination, a larger measured count makes the on-resistance value (R2) of the transistor 63g for a variable resistor larger to generate a gate voltage so that the low potential state discrimination threshold comes to be higher, and then the generated voltage is applied. On the other hand, if the state discrimination unit 6 makes a high potential state discrimination, a larger count makes the on-resistance value (R2) of the transistor 63g for a variable resistor smaller to generate a gate voltage so that the high potential state discrimination threshold comes to be lower, and then the generated voltage is applied.

Here, FIG. 5 illustrates the configuration of only the variable resistor unit 63, but the variable resistor unit 62 may be configured the same as the variable resistor unit 63 shown in FIG. 5. In this case, if the state discrimination unit 6 makes a low-state discrimination, a larger measured count causes the variable resistor unit 62 to make the on-resistance value (R1) of the transistor for a variable resistor larger to generate a gate voltage so that the low potential state discrimination threshold comes to be higher, and then the generated voltage is applied. On the other hand, if the state discrimination unit 6 makes a high potential state discrimination, a larger measured count causes the variable resistor unit 62 to make the on-resistance value (R1) of the transistor for a variable resistor larger to generate a gate voltage so that the high potential state discrimination threshold comes to be lower, and then the generated voltage is applied.

As described above, the integrated circuit 2 (threshold correction circuit 10) of this embodiment comprise noise monitor signal outputting terminal 2b that outputs a noise monitor signal in a low potential state or a high potential state. A noise monitor signal is output from the noise monitor signal outputting terminal 2b to the noise monitor signal line (wiring path) 5, propagated through the monitor signal line 5, and re-input into integrated circuit 2 via the noise monitor signal inputting terminal 2c. On the basis of the re-input noise monitor signal, noise detection signal 13 monitors the state of a noise in a region where the noise monitor signal line 5 is wired. With this configuration, a signal superimposed by a noise caused from the power source or a crosstalk noise can be monitored. On the basis of the monitored noise state, the optimum level of the threshold used in state discrimination unit 6 can be determined. The threshold adjustment unit 14 then adjusts the threshold (the resistances of variable resistor units 62 and 63) of the state discrimination unit 6 to be in the above optimum level.

Namely, in the present embodiment, state discrimination unit 6 monitors a noise using a noise monitor signal and adjusts the threshold while making a state discrimination with reference to a predetermined threshold. For example, if a signal exceeding the threshold for the low potential state discrimination is observed while a noise monitor signal for the low potential state discrimination is output (e.g., see FIG. 6, the output from the state discrimination unit 6 shifts from being in the low potential state to being in the high potential state), the threshold for a low potential state discrimination is adjusted to increase (upper shift) such that the noise superimposed on the signal in the low potential state can be neglected. Conversely, if a signal less than the threshold for the high potential state discrimination is observed while a noise monitor signal in the high potential state is output (e.g., see FIG. 7, the output from the state discrimination unit 6 shifts from being in the high potential state to being in the low potential state), the threshold for the high potential state discrimination is adjusted to decrease (lower shift) such that the noise superimposed on the signal in the high potential state can be neglected. That properly tunes the input circuit (the inverter) 61 of the state discrimination unit 6, so that integrated circuit 2 comes to be tolerant of external noises.

Next, a description will now be made in relation to a procedure of threshold correction performed in the integrated circuit 2 (threshold correction circuit 10) with a threshold correction function with the above configuration with reference to FIGS. 6 and 7 and flow diagram FIG. 8 (steps S1-S7). Here, FIGS. 6 and 7 show waveforms of noise monitor signals on which noises are superimposed for the purpose of explanation of the threshold correction procedure of the present embodiment.

When the power is turned on or when the control unit 15 receives a regular threshold adjustment instruction or an unscheduled threshold adjustment instruction from an external entity (YES route in step S1), control unit 15 sets a noise monitor term of a predetermined time period, and the switching unit 11 switches the state discrimination unit 6 to be connected to the noise monitor signal inputting terminal 2c (the noise monitor signal line 5) (step S2) and additionally the signal generation unit 12 generates a noise monitor signal, which is to be output to the noise monitor signal line 5 output from the noise monitor signal outputting terminal 2b, for the noise monitor term (step S3).

Here, the generated noise monitor signal assumes to alternately take the low potential state (Low state/"0") and the high potential state (High state/"1") in a given cycle, and is therefore exemplified by a clock signal.

Figure 6:
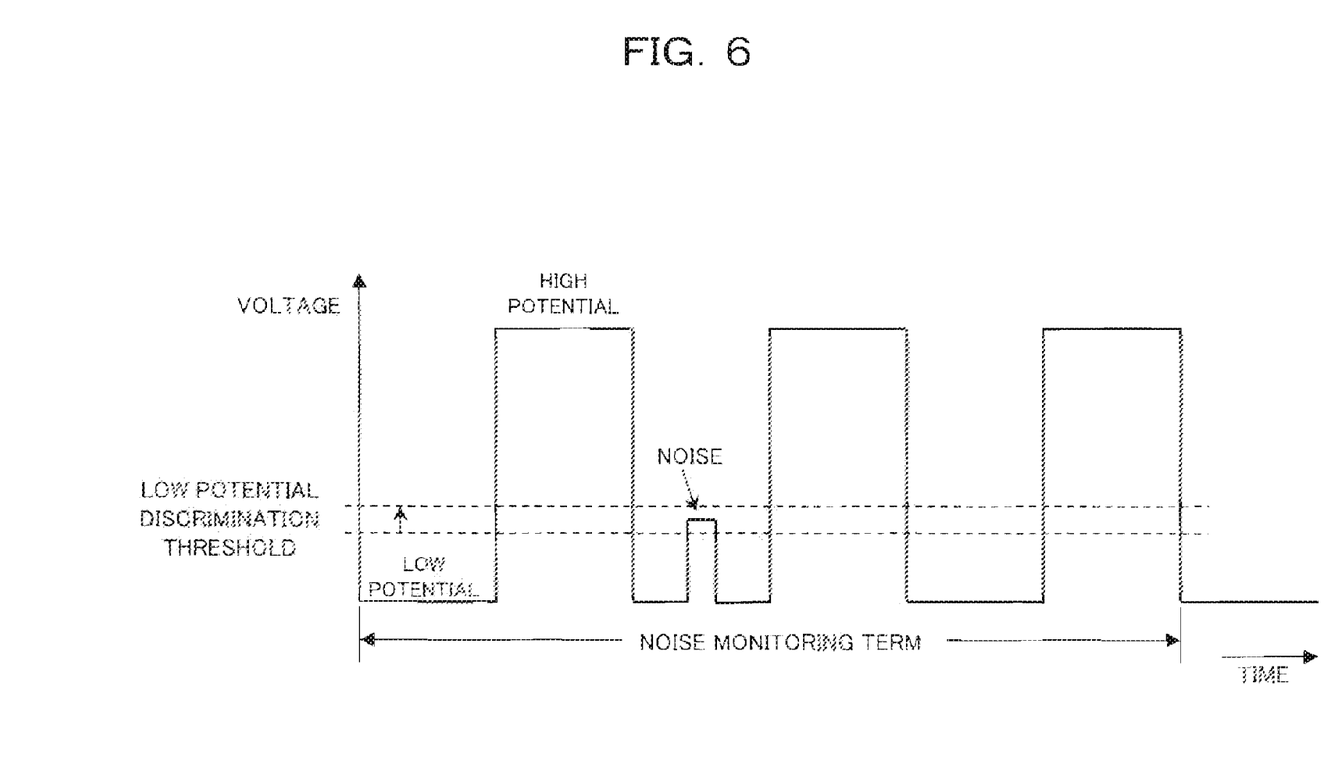
FIG. 6 An illustration of an example of a waveform of a noise-introduced noise monitor signal for explaining a threshold correction operation according to this embodiment.
Figure 7:
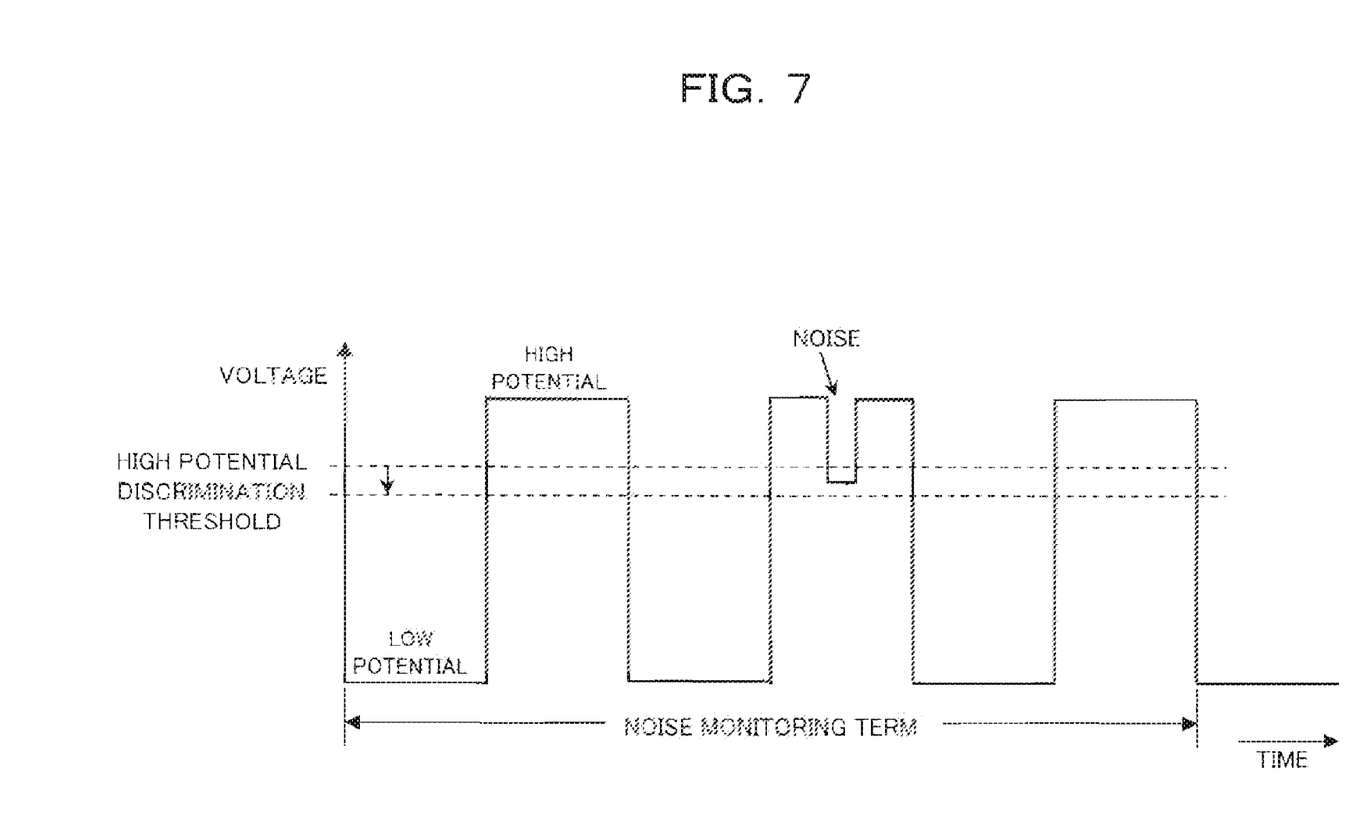
FIG. 7 An illustration of an example of a waveform of a noise-introduced noise monitor signal for explaining a threshold correction operation according to this embodiment.
Figure 8:
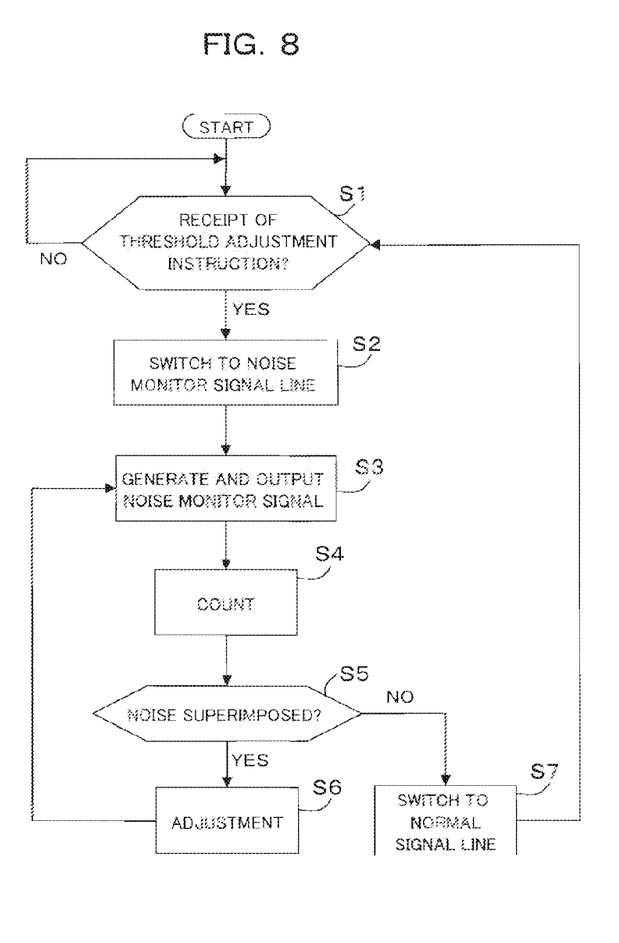
FIG. 8 A flow chart for explaining an operation of an integrated circuit (threshold correction circuit) with a threshold correction function according to this embodiment.

Specifically, the generated noise monitor signal has waveform identical to those shown in FIGS. 6 and 7 from which noises are removed. In the examples shown in FIGS. 6 and 7, the noise monitor term corresponds to the three cycles of a noise signal to begin with being in the low potential state. FIG. 6 shows a waveform when a noise in excess of the threshold for the low potential state discrimination is superimposed on a low potential state portion of the noise monitor signal in performing the low potential state discrimination; and FIG. 7 shows a waveform when a noise less than the threshold for the high potential state discrimination is superimposed on a high potential state portion of the noise monitor signal in performing the high potential state discrimination.

When the noise monitor signal output to the noise monitor signal line 5 is re-input into the integrated circuit 2 from the noise monitor inputting terminal 2c (the noise monitor signal line 5), the re-input noise monitor signal is input into state discrimination unit 6 through the switching unit 11. The state discrimination unit 6 makes a state discrimination on the re-input noise monitoring signal and the result of the state discrimination is input into the noise detection unit 13, which counts at least one of a number of times of signal rise and a number of times of signal fall in the waveform that is the state discrimination result (step S4).

For example, if no noise is superimposed on a noise monitor signal generated and output for the three cycles, the noise monitor signal has three signal rises and three signal falls. However, if a noise more than the threshold for a low potential state discrimination is superimposed as shown in FIG. 6 during a low potential state discrimination being made by the state discrimination unit 6, the number of times of signal rise and the number of times of signal fall measured by the noise detection unit 13 are both four because of the presence of the noise. In the same manner, if a noise less than the threshold for a high potential state discrimination is superimposed as shown FIG. 7 during a high potential state discrimination being made by the state discrimination unit 6, the number of times of signal rise and the number of times of signal fall made by the noise detection unit 13 are both four because of the presence of the noise.

The introduction or the non-introduction (the presence or the absence) of a noise which affects a state discrimination by means of a threshold can be judged by as to whether or not the result of counting (the actual measured value) by the noise detection unit 13 exceeds the ideal count (in this example, three) in the case where no noise is introduced (step S5). The judgment on the presence or the absence of a noise in step S5 assumed to be made in the control unit 15 in the present embodiment.

If the actual measurement value exceeds the ideal measured value, that is, if a noise is superimposed (YES route in step S5), the threshold adjustment unit 14 adjusts the resistance values of the variable resistor units 62 and 63 of the state discrimination unit 6 such that the introduced noise is not introduced in a state judgment by the state discrimination unit 6, in other words, such that the state discrimination is made without being affected by a noise (step S6).

Specifically, when the state discrimination unit 6 is to made a low potential state discrimination, as shown in FIG. 6, the resistance values of the variable resistor units 62 and 63 are adjusted that such that the threshold for the low potential state discrimination is increased for a predetermined amount with the intention that the noise introduced on a signal in the low potential state can be neglected. On the other hand, when the state discrimination unit 6 is to made a high potential state discrimination, as shown in FIG. 7, the resistance values of the variable resistor units 62 and 63 are adjusted that such that the threshold for a high potential state discrimination is decreased for a predetermined amount with the intention that the noise introduced on a signal in the high potential state can be neglected.

After that, the procedure returns to step S3 and performs another noise monitoring (steps S3-S5). Steps S3-S5 are repetitiously performed until step S5 judges that no noise is superimposed.

When no noise introduction is judged in step S5 (NO route), the control unit 15 prompts the switching unit 11 to switch the state discrimination unit 6 to be connected to the signal inputting terminal 2*a* (the signal line 4) (step S7) and the procedure returns to step S1.

As described above, in the circuit board 1 with a threshold correction function, the integrated circuit 2 with a threshold correction function, and the threshold correction circuit 10 of this embodiment, a noise is monitored which affects a signal in the region between the integrated circuits 2 and 3 on the circuit board 1, and a state of a noise caused from a simultaneous switching noise or the like can be feedback on the level of the threshold used in the state discrimination unit 6, so that the optimum threshold voltage (the threshold level) can be obtained.

In other words, various noises (a crosstalk noise, a simultaneous switching noise, an external noise, a power source noise, a ground noise, and others) to be introduced into a signal propagated through the signal line 4 on the circuit board 1 are monitored, and the threshold for a signal state discrimination is automatically adjusted considering the affects caused by these noises. This configuration makes it possible to surely make a signal state discrimination without being affected by these noises even if the amplitude of a signal is reduced for higher-speed transmission and lowered electric power.

The present invention should by no means be limited to the foregoing embodiment, and various changes and modifications can be suggested without departing the gist of the present invention.

For example, in the foregoing embodiment, the threshold correction function is incorporated in the integrated circuit 2. Alternatively, the other integrated circuit 3 may additionally have the same threshold correction function as that of the integrated circuit 2 so that the same threshold correction as performed in the integrated circuit 2 is performed also in the integrated circuit 3. Further alternatively, the threshold correction circuit 10 may be disposed on the 1, not in the integrated circuit 2, so that the thresholds of all the integrated circuits disposed on the circuit board 1 are collectively corrected.

INDUSTRIAL APPLICABILITY

As described above, the present invention monitors various types of noises which are to be introduced on signals propagating through signal lines on a circuit board and automatically adjusts the thresholds for signal state discriminations. It is therefore possible to surely make a signal state discrimination without being affected by these noises even if the amplitude of a signal is reduced for higher-speed transmission and lowered electric power.

As a consequence, the present invention is preferably applied to a state discrimination made on a signal on a circuit board such as a PCB and is considered to be highly variable.

The invention claimed is:

1. A threshold correction circuit for correcting a threshold used as a state discrimination reference for a state discrimination on a signal propagated through a signal line wired in a predetermined area, comprising:
    a signal generation unit generating a noise monitor signal;
    a noise monitor signal line wired in the predetermined area, and receiving and propagating the noise monitor signal generated by said signal generation unit;
    a noise detection unit detecting a noise which has been introduced into said noise monitor signal propagated through said noise monitor signal line and which affects the state discrimination using the threshold; and
    a threshold adjustment unit, if said noise detection unit detects the noise, adjusting the threshold such that the state discrimination is not affected by the noise.

2. A threshold correction circuit according to claim 1, wherein
    in the state discrimination which determines the signal to be in a low potential state when a level of the signal is the threshold or less while determines the signal not to be in the low potential state when the level of the signal exceeds the threshold,
    said signal generation unit generates, as the noise monitor signal, a noise monitor signal in the low potential state, and inputs the noise monitor signal into said noise monitor signal line, and
    said noise detection unit detects, as the noise, a state in which the level of the noise monitor signal to be in the low potential state propagated through said noise monitor signal line exceeds the threshold.

3. A threshold correction circuit according to claim 2, wherein
    said noise detection unit counts at least one of the number of times of signal rise, at which the level of the noise monitor signal is shifted from a state of being the threshold or less to a state in excess of the threshold, and the number of times of signal fall, at which the level of the noise monitor signal shifts from a state in excess of the threshold to a state of being the threshold or less; and
    said threshold adjustment unit adjusts the threshold in accordance with one or more counts made by said noise detection unit.

4. A threshold correction circuit according to claim 3, wherein said threshold adjustment unit adjusts the threshold to be higher if the counts are larger.

5. A threshold correction circuit according to claim 1, wherein
    in the state discrimination which determines the signal to be in a high potential state when a level of the signal is the threshold or more while determines the signal not to be in the high potential state when the level of the signal is less than the threshold,
    said signal generation unit generates, as the noise monitor signal, a noise monitor signal in the high potential state, and inputs the noise monitor signal into said noise monitor signal line, and
    said noise detection unit detects, as the noise, a state in which the level of the noise monitor signal to be in the high potential state propagated through said noise monitor signal line is lower than the threshold.

6. A threshold correction circuit according to claim 5, wherein said noise detection unit counts at least one of the number of times of signal fall, at which the level of the noise monitor signal shifts from a state of being the threshold or more to a state of being less than the threshold, and the number of times of signal rise, at which the level of the noise monitor signal is shifted from a state of being less than the threshold to a state of being the threshold or more; and said threshold adjustment unit adjusts the threshold in accordance with the result of the counting made by said noise detection unit.

7. A threshold correction circuit according to claim 6, wherein said threshold adjustment unit adjusts the threshold to be lower if the counts are larger.

8. A circuit comprising:
a signal generation unit generating a noise monitor signal;
a noise monitor signal outputting terminal outputting the noise monitor signal generated by said signal generation unit;
a noise monitor signal inputting terminal inputting the noise monitor signal outputted;
a noise detection unit detecting a noise which has been introduced into the noise monitor signal input via said noise monitor inputting terminal and which affects a state discrimination using a threshold; and
a threshold adjustment unit, if said noise detection unit detects the noise, adjusting the threshold such that the state discrimination is not affected by the noise.

9. A circuit according to claim 8, wherein
in the state discrimination which determines the signal to be in a low potential state when a level of the signal is the threshold or less while determines the signal not to be in the low potential state when the level of the signal exceeds the threshold,
said signal generation unit generates, as the noise monitor signal, a noise monitor signal in the low potential state, and inputs the noise monitor signal into a noise monitor signal line, and
said noise detection unit detects, as the noise, a state in which the level of the noise monitor signal to be in the low potential state propagated through the noise monitor signal line exceeds the threshold to be the noise.

10. A circuit according to claim 9, wherein:
said noise detection unit counts at least one of the number of times of signal rise, at which the level of the noise monitor signal is shifted from a state of being the threshold or less to a state in excess of the threshold, and the number of times of signal fall, at which the level of the noise monitor signal shifts from a state in excess of the threshold to a state of being the threshold or less; and
said threshold adjustment unit adjusts the threshold in accordance with one or more counts made by said noise detection unit.

11. A circuit according to claim 10, wherein said threshold adjustment unit adjusts the threshold to be higher if the counts are larger.

12. A circuit according to claim 8, wherein
in the state discrimination which determines the signal to be in a high potential state when a level of the signal is the threshold or more while determines the signal not to be in the high potential state when the level of the signal is less than the threshold,
said signal generation unit generates, as the noise monitor signal, a noise monitor signal in the high potential state, and inputs the noise monitor signal into a noise monitor signal line, and
said noise detection unit detects, as the noise, a state in which the level of the noise monitor signal to be in the high potential state propagated through the noise monitor signal line is lower than the threshold to be the noise.

13. A circuit according to claim 12, wherein
said noise detection unit counts at least one of the number of times of signal fall, at which the level of the noise monitor signal shifts from a state of being the threshold or more to a state of being less than the threshold, and the number of times of signal rise, at which the level of the noise monitor signal is shifted from a state of being less than the threshold to a state the threshold or more; and
said threshold adjustment unit adjusts the threshold in accordance with the result of the counting made by said noise detection unit.

14. A circuit according to claim 13, wherein said threshold adjustment unit adjusts the threshold to be lower if the counts are larger.

15. A circuit board with a threshold correction function on which two or more integrated circuits that communicate with each other by a signal through a signal line and that make a state discrimination on the signal propagated through the signal line, regarding a threshold as a reference, are mounted, comprising:
a signal generation unit generating a noise monitor signal;
a noise monitor signal line wired among said two or more integrated circuits, and receiving and propagating the noise monitor signal generated by said signal generation unit;
a noise detection unit detecting a noise which has been introduced into the noise monitor signal propagated through said noise monitor signal line and which affects the state discrimination using the threshold; and
a threshold adjustment unit, if said noise detection unit detects the noise, adjusting the threshold such that the state discrimination is not affected by the noise.

16. A circuit board with a threshold correction function according to claim 15, wherein:
said signal generation unit, said noise detection unit and said threshold adjustment unit are included in a first integrated circuit among said two or more integrated circuit; and
said noise monitor signal line is wired so as to extend in the vicinity of a second integrated circuit among said two or more integrated circuits from said first integrated circuit and turn back from the vicinity to said first integrated circuit.

17. A circuit board with a threshold correction function according to claim 15, wherein
in the state discrimination which determines the signal to be in a low potential state when a level of the signal is the threshold or less while determines the signal not to be in the low potential state when the level of the signal exceeds the threshold,
said signal generation unit generates, as the noise monitor signal, a noise monitor signal in the low potential state, and inputs the noise monitor signal into said noise monitor signal line, and
said noise detection unit detects, as the noise, a state in which the level of the noise monitor signal to be in the low potential state propagated through said noise monitor signal line exceeds the threshold.

18. A circuit board with a threshold correction function according to claim 17, wherein
said noise detection unit counts at least one of the number of times of signal rise, at which the level of the noise monitor signal is shifted from a state of being the threshold or less to a state in excess of the threshold, and the number of times of signal fall, at which the level of the noise monitor signal shifts from a state in excess of the threshold to a state of being the threshold or less; and said threshold adjustment unit adjusts the threshold in accordance with one or more counts made by said noise detection unit.

19. A circuit board with a threshold correction function according to claim 15, wherein in the state discrimination which determines the signal to be in a high potential state when a level of the signal is the threshold or more while determines the signal not to be in the high potential state when the level of the signal is less than the threshold, said signal generation unit generates, as the noise monitor signal, a noise monitor signal in the high potential state and inputs the noise monitor signal into said noise monitor signal line, and said noise detection unit detects, as the noise, a state in which the level of the noise monitor signal to be in the high potential state propagated through said noise monitor signal line is lower than the threshold.

20. A circuit board with a threshold correction function according to claim 15, wherein said noise detection unit counts at least one of the number of time of signal fall, at which the level of the noise monitor signal shifts from a state of being the threshold or more to a state of being less than the threshold, and the number of times of signal rise, at which the level of the noise monitor signal is shifted from a state of being less than the threshold to a state of being the threshold or more; and said threshold adjustment unit adjusts the threshold in accordance with the result of the counting made by said noise detection unit.

* * * * *